United States Patent
Reber et al.

(10) Patent No.: US 8,486,839 B2
(45) Date of Patent: Jul. 16, 2013

(54) METHODS AND APPARATUS TO IMPROVE RELIABILITY OF ISOLATED VIAS

(75) Inventors: Douglas M. Reber, Austin, TX (US); Lawrence N. Herr, Coupland, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 104 days.

(21) Appl. No.: 13/114,100

(22) Filed: May 24, 2011

(65) Prior Publication Data

US 2012/0299190 A1 Nov. 29, 2012

(51) Int. Cl.
*H01L 21/311* (2006.01)

(52) U.S. Cl.
USPC .... 438/700; 438/270; 438/769; 257/E21.006; 257/E21.267; 257/E21.278; 257/E21.293; 257/E21.545; 257/E21.546; 257/E21.547; 257/E21.548

(58) Field of Classification Search
USPC ............... 438/270, 700, 724, 757, 775, 769, 438/687; 257/E21.006, E21.267, E21.278, 257/E21.293, E21.545, E21.546, E21.547, 257/E21.548
See application file for complete search history.

(56) References Cited

U.S. PATENT DOCUMENTS

| | | |
|---|---|---|
| 6,436,850 B1 | 8/2002 | Morales |
| 6,459,156 B1 * | 10/2002 | Travis et al. ............... 257/774 |
| 6,797,633 B2 | 9/2004 | Jiang et al. |
| 7,476,602 B2 | 1/2009 | Ajmera et al. |
| 7,564,136 B2 | 7/2009 | Yeh et al. |

OTHER PUBLICATIONS

Fujimaki, T., et al., "Mechanism of Moisture Uptake Induced Via Failure and its Impact on 45 nm Node Interconnect Design", Electron Devices Meeting, 2005. IEDM Technical Digest. IEEE International, Dec. 5, 2005, p. 183.

* cited by examiner

*Primary Examiner* — David Nhu
(74) *Attorney, Agent, or Firm* — Mary Jo Bertani; Daniel D. Hill

(57) ABSTRACT

A method for tiling selected vias in a semiconductor device is provided. The semiconductor device includes a plurality of vias. The method includes: generating a layout database for the semiconductor device; identifying isolated vias of the plurality of vias; selecting the isolated vias; defining a zone around each of the selected isolated vias; and adding tiling features on a metal layer above the selected isolated vias and within the zone. The method improves reliability of the semiconductor device by allowing moisture to vent from around the vias.

15 Claims, 3 Drawing Sheets

METHODS AND APPARATUS TO IMPROVE RELIABILITY OF ISOLATED VIAS

BACKGROUND

1. Field

This disclosure relates generally to semiconductor processing, and more particularly, to improving reliability of isolated vias.

2. Related Art

Integrated circuits are formed with metal layers stacked on top of one another and dielectric layers between the metal layers to insulate the metal layers from each other. Normally, each metal layer has an electrical contact to at least one other metal layer. Electrical contact can be formed by etching a hole (i.e., a via) in the interlayer dielectric that separates the metal layers, and filling the resulting via with a metal to create an interconnect. A "via" normally refers to any recessed feature such as a hole, line or other similar feature formed within a dielectric layer that, when filled with a conductive material, provides an electrical connection through the dielectric layer to a conductive layer underlying the dielectric layer.

With the number of transistors that are now present on integrated circuits, the number of vias can exceed a billion and there can be ten or more different conductive layers. Even if each via is highly reliable, there are so many vias that it is likely for there to be at least one via failure. Low-k BEOL (Back-End of Line) interlayer dielectrics commonly used in advanced technology integrated circuit manufacturing can have trapped moisture and hydroxyl ions. These trapped water species pose a risk of oxidizing via barrier material if not sufficiently outgassed. Vias with oxidized tantalum barriers exhibit excessive via resistance that has been shown to cause timing delays in semiconductor devices. A barrier material is used to contain the migration of a copper used for a metal layer through the isulating material.

Barrier materials typically used today are a combination of tantalum and tantalum nitride, or just tantalum. Tantalum nitride has good adhesion properties to the oxide dieletric. However, other materials can be used. One problem which is specifically worse for tantalum is that tantalum oxidizes to form tantalum pentoxide and expands to a volume which is several times larger than just the tantalum. Also, the Tantalum pentoxide is an insulator and has very high resistance.

Accordingly, it is desirable to provide a technique for improving the reliability of vias and uniformity of via resistance.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and semiconductor devices are disclosed herein that improve reliability of isolated vias and/or improve uniformity of via resistance by adding tiling features around the isolated vias to improve moisture dissipation during outgassing processes. This is better understood by reference to the following description and the drawings.

Figure 1:
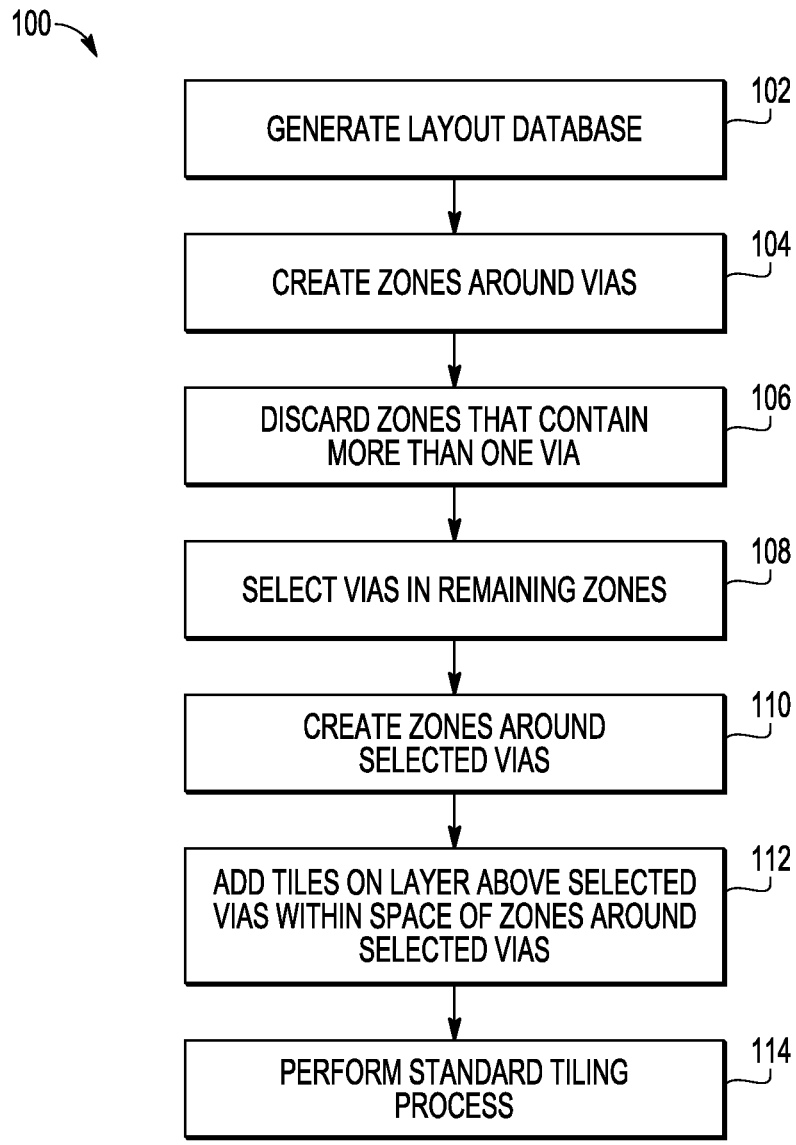
FIG. 1 is a flow diagram of an embodiment of a process for determining where to add metal tiles around one or more vias to improve reliability of a semiconductor device.

FIG. 1 is a flow diagram of an embodiment of process 100 for determining where to add metal tiles around one or more vias to improve reliability of a semiconductor device or integrated circuit. Process 102 includes generating a database for the semiconductor device that includes the type, size, location and interconnections between features or components such as metal layers, dielectric layers, and vias connecting the conductive layers in the semiconductor device. Any suitable type of integrated circuit design tool can be used in process 102. One example of a commercially available tool that can be used is the IC Station design system by Mentor Graphics, Inc. of Wilsonville, Oreg. An additional tool called Calibre by Mentor Graphics can be used to manipulate a database for an IC designed using IC Station.

Figure 2:
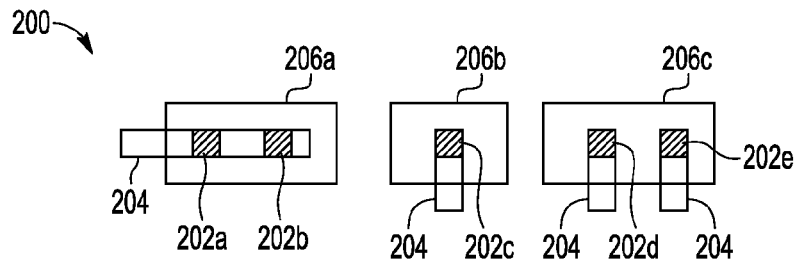
FIG. 2 is a top view of an embodiment of a partial layout of a semiconductor device during a first stage of design.

With reference with FIGS. 1 and 2, FIG. 2 is a top view of an embodiment of a partial layout of semiconductor device 200 at a first stage of design. Semiconductor device 200 includes a plurality of vias 202a, 202b, 202c, 202d, 202e (collectively, "vias 202"), and metal lines 204 coupled to the vias 202. Using the database generated in process 102, process 104 includes creating or determining zones 206a, 206b, 206c (collectively, "zones 206") around vias 202 within a predetermined distance around vias 202. Note that there may be a plurality of isolated vias 202c in semiconductor device 200.

In the example shown, zone 206a is a polygon shape around vias 202a, 202b; zone 206b is a polygon shape around via 202c; and zone 206c is a polygon around vias 202d, 202e. Although zones 206 are shown as polygons, zones 206 can be any suitable shape.

Vias 202 are typically created with approximately the same shape, shown as a square in FIG. 2. In some implementatiosn, zones 206 can be determined by upsizing the original size of vias 202 by a suitable distance. The particular upsize distance to determine zones 206 can be based on the size of the components of the semiconductor device 200. Semiconductor processing technology is often referred to based on the drawn transistor minimum gate length. For example, the term 90 nm technology refers to a silicon technology with a drawn transistor minimum gate length of 90-100 nm. As a further example, vias 202 in a 90 mm technology semiconductor device 200 can be 0.13 micron per side and the upsize distance can be 0.155 micron per side to form polygons that are 0.44 microns per side. Other suitable via sizes and shapes, and upsize distances for forming zones 206 can be used. Other techniques for creating zones 206 around vias 202 can also be used instead of temporarily upsizing vias 206.

Zones 206 that overlap or touch one another can be combined into one zone. For example, larger zones 206a, 206c were formed by combining individual zones (not shown) around respective vias 202a/202b and 202d/202e because the individual zones around vias 202a/202b and 202d/202e overlapped or touched one another.

Process 106 includes identifying isolated or sparse vias 202. In some embodiments, isolated vias 202 can be identified by determining the number of vias 202 within each zone 206. In the example shown, zone 206b includes only one via 202c while zone 206a includes vias 202a/202b and zone 206c includes vias 202d/202e. Thus, via 202c is identified as an isolated via. Other techniques for identifying isolated vias 202 can be used. For example, vias 202 that are not within a specified distance from any other vias 202 may be considered isolated vias. Alternatively, a via can be identified as isolated if the via is within a zone that has not been merged with another zone. As a further alternative, a via can be identified as isolated if no other vias exist in a particular layer within two times a minimum pitch between metal lines 204 for the semiconductor device. Note, it is common for a plurality of metal lines 204 to run in parallel in an integrated circuit and be at or near minimum pitch. Pitch is the distance between centers of lines 204 adjacent to each other.

Figure 3:
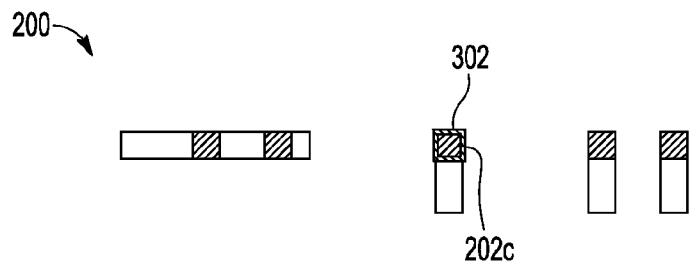
FIG. 3 is a top view of the semiconductor device of FIG. 2 during a subsequent stage of design.

Referring to FIGS. 1 and 3, FIG. 3 is a top view of semiconductor device 200 of FIG. 2 after a subsequent stage of design including process 108, in which isolated via 202c is selected. Process 108 can include showing selected and unselected vias 202 to the user of the design system via display device. For example, FIG. 3 shows highlight 302 around via 202c to indicate that isolated via 202c is selected, however, selection of isolated via 202c can be performed in logic instructions executed by a computer processor and therefore may not otherwise be visible to a user. Process 108 can also interactively allow a user to select and deselect vias manually, however, given the large number of vias that may be included in a semiconductor device, manual selection is generally not performed.

Figure 4:
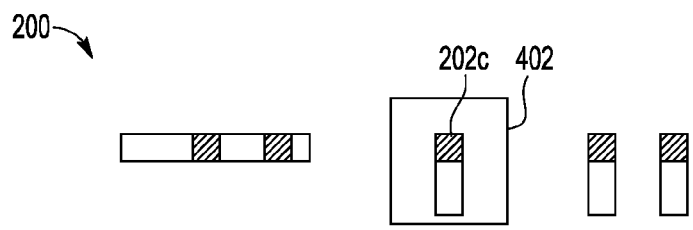
FIG. 4 is a top view of the semiconductor device of FIG. 3 during a subsequent stage of design.

Referring to FIGS. 1 and 4, FIG. 4 is a top view of semiconductor device 200 of FIG. 3 after a subsequent stage of design including process 110 in which zones 402 are created around vias 202c selected in process 108. In some implementations, selected vias 202c are temporarily upsized based on the original via size to form tile zone 402. For example, in a 90 mm technology, a rectangular via 202c that is 0.13 microns per side can be upsized by 0.9 microns per side to form tile zone 402 that is 1.93 microns per side.

Alternatively, tiling zones 402 around each of selected isolated vias 202 can be defined to have a dimension no larger than an order of magnitude of a minimum metal feature size for the semiconductor device. In the semiconductor industry, the term minimum metal feature size refers to the smallest feature size allowed to be used by a designer.

Other suitable via sizes and shapes, and upsize distances for forming tile zone 402 in process 110 can be used. Additionally, other techniques for creating zones 402 around selected vias 202c can also be used instead of temporarily upsizing vias 206.

Process 110 can further include presenting an image of tile zones 402 on semiconductor device 200 to the user of the design system via a display device. Process 110 can also interactively allow a user to add, delete, and/or resize tile zones 402 manually, if desired.

Figure 5:
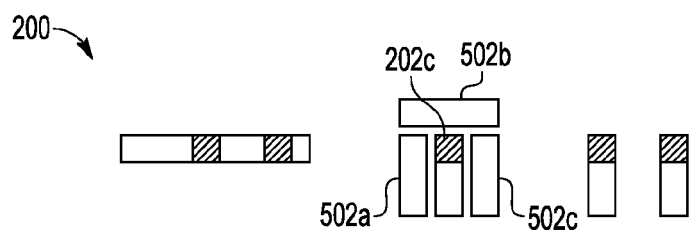
FIG. 5 is a top view of the semiconductor device of FIG. 4 during a subsequent stage of design.

Referring to FIGS. 1 and 5, FIG. 5 is a top view of semiconductor device 200 of FIG. 4 after a subsequent stage of design including process 112 in which tiling features 502a, 502b, 502c (collectively, "tiling features 502") are inlaid in a dielectric layer above that in which selected isolated via(s) 206c are formed and within tile zone 402 (FIG. 4). Tiling features 502 are used to form a pattern for creating trenches around selected vias 202. The trenches allow out gassing of more oxygen sources that can cause delamination and high via resistance than would be possible without the trenches. Further, since metal features are typically formed between dielectric layers to form interconnects with vias 202 between metal layers, no extra processing steps or time is required to include additional tiling features 502.

Any suitable technique or criteria can be used to determine the size, shape, position, and orientation of tiling features 502. For example, tiling features 502 may be configured to obtain metal coverage no less than twenty percent of surface area within tiling zone 402 (FIG. 4). Tiling features 502 may be oriented along x and y directions, or at an angle. The size and shape of tiling features 502 may be selected based on the capabilities and minimum feature size of the equipment being used to manufacture semiconductor device 200.

An example for configuring tiling features 502 for 90 mm technology can include tiling features 502 that have a height of 0.14 um, and vary in width from 0.5 um to 0.8 um in increments of 0.1 um. These added tiling features 502 added in accordance with the design rules governing the allowed spacing to other features in the design such as metal interconnects, other tiles, and other restricted areas.

In some embodiments, method 100 for tiling selected vias 202c in a semiconductor device 200 having a plurality of vias 202 includes generating a layout database for the semiconductor device in process 102. A plurality of polygon shapes 206 are created in process 106 by temporarily upsizing the plurality of vias 202. Polygon shapes 206 that enclose more than one via 202 are discounted as being not isolated in process 106. Vias 202 in remaining polygon shapes 206 are selected as being isolated vias 202c in process 108. Process 110 can include temporarily upsizing the selected vias 202c by a predetermined amount based on an original size of the selected vias 202c.

Process 112 includes adding a plurality of tiling features 502 on a metal layer above selected vias 202c and within zones 402 around selected vias 202c. In some embodiments process 112 can include adding tiling features 502 within a space 402 enclosed by the upsized selected vias 202c. Adding the tiling features 502 on a metal layer above selected vias 202c and within space 402 enclosed by temporarily upsized selected vias 202c includes defining the space 402 enclosed by the upsized selected vias 202c as being no larger than an order of magnitude of a minimum metal feature size for semiconductor device 200.

For example, process 112 can include adding a plurality of tiling features 502 to obtain a metal coverage of no less than twenty percent of surface area within the space 402 (FIG. 4) enclosed by the upsized selected vias 202c. As a more specific example, process 112 can include selecting dimensions of polygons 502 used to pattern trenches for metallization such that tiling features 502 are capable of fitting into an existing layout and to meet a density goal of greater than twenty percent in space 402 enclosed by temporarily upsized selected vias 202c. Other suitable percentages for the tiling density goal can be used, however.

Process 114 includes forming additional tiling features to meet global and local metal density required for uniformity of semiconductor device processing such as photo lithography and chemical mechanical surface polishing. The tilling is formed in the dielectric at the same time and in a like manner as the trenches. The metal trenches correspond to circuit design traces needed to carry current or distribute voltages whereas the tiling features are added around the trenches to meet manufacturability constraints.

Figure 6:
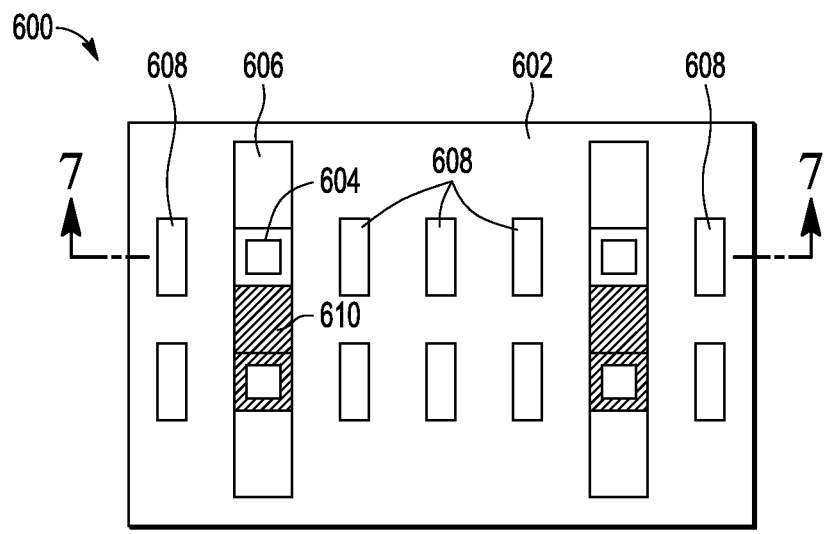
FIG. 6 is a top view of an embodiment of a semiconductor device.
Figure 7:
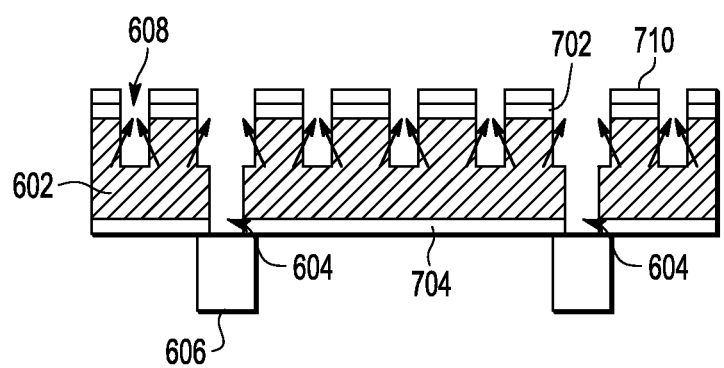
FIG. 7 is a cross-section view of the semiconductor device of FIG. 6.

Referring to FIGS. 6 and 7, FIG. 6 is a top view of an embodiment of a portion of a semiconductor device 600 including lower dielectric layer 602, a plurality of vias 604, lower level metal lines 606, tiling features 608, and upper level metal lines 610. FIG. 7 is a cross-section view of semiconductor device 600 of FIG. 6 that shows lower dielectric layer 602, a plurality of vias 604, lower level metal lines 606, tiling features 608 in dielectric layer 602, upper dielectric layer 702, etch stop layer 704, and anti-reflective layer 710. The portion of semiconductor device 600 may be built on an insulating layer formed on a semiconductor substrate (not shown).

As an example, metal lines 606, 610 may be formed of copper or other suitable conductive material. Etch stop layer 704 may be formed of silicon carbon nitride (SiCN) having a thickness ranging from 200-600 Angstroms. Dielectric layer 602 may be formed of SiCOH with a thickness ranging from 4000 to 6000 Angstroms. Dielectric layer 702 may be formed of tetra-ethoxy-silane (TEOS) having a thickness ranging from 700-1300 Angstroms. Anti-reflective layer 710 may be formed of silicon rich silicon nitride (SRN) having a thickness ranging from 400 to 700 Angstroms, or silicon rich silicon oxynitride (SRON) having a thickness ranging from 250 to 500 Angstroms. Other suitable thicknesses and materials may be used, however.

Interconnect delay is a major limiting factor in the effort to improve the speed and performance of integrated circuits (ICs). One way to minimize interconnect delay is to reduce interconnect capacitance by using low-k materials during production of the ICs. Such low-k materials have also proven useful for low temperature processing. Low-k materials have been developed to replace relatively high dielectric constant insulating materials, such as silicon dioxide. In particular, low-k films are being utilized for inter-level and intra-level dielectric layers between metal layers of semiconductor devices. Additionally, in order to further reduce the dielectric constant of insulating materials, material films are formed with pores, i.e., porous low-k materials.

Accordingly, dielectric layer 602 can, for example, contain SiCOH, which is a low-k dielectric material. Low-k dielectric materials have a nominal dielectric constant less than the dielectric constant of SiO2, which is approximately 4 (e.g., the dielectric constant for thermally grown silicon dioxide can range from 3.8 to 3.9). High-k materials have a nominal dielectric constant greater than the dielectric constant of SiO2. Low-k dielectric materials may have a dielectric constant of less than 3.7, or a dielectric constant ranging from 1.6 to 3.7. Low-k dielectric materials can include fluorinated silicon glass (FSG), carbon doped oxide, a polymer, a SiCOH-containing low-k material, a non-porous low-k material, a porous low-k material, a spin-on dielectric (SOD) low-k material, or any other suitable dielectric material.

Examples of two materials found suitable for low-K dielectrics are PECVD SiCOH dielectrics formed with either TMCTS (or OMCTS precursors). A precursor is a material which contains the SiCOH molecules in a larger carrier molecule which flows in a plasma chemical vapor deposition system for depositing the dielectric film. These films have many desirable characteristics but, as deposited, have residual OH (hydroxyl), and H2O (water) which require outgassing. Outgassing is a process during which semiconductor device 600 is heated at a specified temperature for a specified duration of time to allow the moisture in low-K dielectric layer 602 to dissipate.

Dielectric layer 702 may also provide a waterproof barrier that prevents moisture from seeping into as well as out of dielectric layer 602. If dielectric layer 702 is formed before substantially all of the moisture is outgassed from dielectric layer 602, residual oxygen sources could react with metal in vias 202 and layers 606, 610 to form oxides that causes delamination between metal layers 606, 610 and dielectric layers 602, 702, as well as create high via resistance. Areas with higher via density provide more exposed surface area of dielectric layer 602 through which moisture can evaporate. Moisture can be trapped in areas with low via density however. Accordingly, placing tiling features 608 around isolated vias 604 allows greater dissipation of residual oxygen (e.g., OH (hydroxyl) and H2O (water)) in dielectric layer 602 during outgassing process steps prior to metal forming steps as semiconductor device 600 is manufactured.

By now it should be appreciated that there has been provided a semiconductor device including a first insulating layer, first metal conductor 606 formed over the first insulating layer, and second insulating layer 602 comprising a low-k oxide or insulating material formed over the first metal conductor 606. Second metal conductor 610 is formed over the second insulating layer 602. A via 604 is formed in the second insulating layer 602 connecting the first metal conductor 606 to the second metal conductor 610. The via 604 is the only via within a predetermined area. A plurality of tiling features 608 are formed in the second insulating layer 602 within the predetermined area. The tiling features 608 provide moisture venting for via 604.

In other aspects, the low-k insulating material is an insulating material having a relative permittivity of less than about 3.9.

In further aspects, the moisture is vented during a heating step of the semiconductor device.

In still further aspects, the plurality of trenches comprise a metal.

In further aspects, metal density within the predetermined area is greater than about twenty percent.

In other embodiments, a method for tiling selected vias in a semiconductor device having a plurality of vias includes generating a layout database for the semiconductor device, identifying isolated vias of the plurality of vias, selecting the isolated vias, defining a zone around each of the selected isolated vias, and adding tiling features on a metal layer above the selected isolated vias and within the zone.

In some aspects of the method, identifying isolated vias further includes creating a plurality of polygon shapes by upsizing the plurality of vias, and identifying an isolated via as being a via within a polygon shape that has not been merged with another polygon shape.

In further aspects of the method, adding tiling features on a metal layer further comprises the metal layer being an inlaid metal layer.

In further aspects of the method, defining a zone further comprises upsizing the selected isolated vias a predetermined amount based on an original size of the isolated vias.

In further aspects of the method, defining a zone around each of the selected isolated vias further comprises defining the zone to have a dimension no larger than an order of magnitude of a minimum metal feature size for the semiconductor device.

In further aspects of the method, identifying isolated vias of the plurality of vias further comprises identifying isolated vias to be vias having no other vias within two times a minimum pitch between metal lines for the semiconductor device.

In further aspects of the method, adding tiling features further comprises adding tiling features to obtain a metal coverage of no less than twenty percent of surface area within the zone.

In further aspects, the method is performed for interlevel dielectric layers of the semiconductor device comprising a low-k oxide.

In further aspects of the method, defining a zone around each of the selected isolated vias further comprises upsizing the selected isolated vias by 0.9 microns per side.

In still other embodiments, a method for tiling selected vias in a semiconductor device having a plurality of vias comprises generating a layout database for the semiconductor device, creating a plurality of polygon shapes by upsizing the plurality of vias, discounting, discarding, or otherwise ignoring polygon shapes of the plurality of polygon shapes that enclose more than one via as being not isolated, selecting vias in remaining polygon shapes as being isolated vias, upsizing the selected vias by a predetermined amount based on an original size of the selected vias, and adding a plurality of tiling features on a metal layer above the selected vias and within a space enclosed by the upsized selected vias.

In further aspects of the method, adding a plurality of tiling features on a metal layer above the selected vias and within a space enclosed by the upsized selected vias further comprises defining the space enclosed by the upsized selected vias as being no larger than an order of magnitude of a minimum metal feature size for the semiconductor device.

In further aspects of the method, selecting dimensions of the polygons used to pattern the tiling features for metallization such that the tiling features are capable of fitting into an existing layout and to meet a density goal of greater than 20% in the space enclosed by the upsized selected vias.

In further aspects of the method, selecting vias in remaining polygon shapes as being isolated vias further comprises sizing the polygon shapes to be no greater than two times a minimum pitch between metal lines for the semiconductor device.

In further aspects of the method, adding a plurality of tiling features on a metal layer above the selected vias and within a space enclosed by the upsized selected vias further comprises adding tiling features to obtain a metal coverage of no less than twenty percent of surface area within the space enclosed by the upsized selected vias.

In further aspects of the method, the method is performed for interlevel dielectric layers of the semiconductor device comprising a low-k oxide.

Process 100 can be performed by executing program logic instructions on a general purpose computer, such as a workstation coupled to a mainframe computer, and/or a desktop, laptop, tablet, or notebook computer. The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Furthermore, those skilled in the art will recognize that boundaries between the functionality of the above described processes and methods are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Although the disclosure is described herein with reference to specific embodiments, various modifications and changes can be made without departing from the scope of the present disclosure as set forth in the claims below. For example, the structure was described as adding a conductive line under the dangling via, the described approach is also applicable to the situation in which the added conductive line over the dangling via. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for tiling selected vias in a semiconductor device having a plurality of vias, the method comprising:
   generating a layout database for the semiconductor device;
   identifying isolated vias of the plurality of vias;
   selecting the isolated vias;
   defining a zone around each of the selected isolated vias; and
   adding tiling features on a metal layer above the selected isolated vias and within the zone.

2. The method of claim 1, wherein identifying isolated vias further comprises:
   creating a plurality of polygon shapes by upsizing the plurality of vias; and
   identifying an isolated via as being a via within a polygon shape that has not been merged with another polygon shape.

3. The method of claim 1, wherein adding tiling features on a metal layer, further comprises the metal layer being an inlaid metal layer.

4. The method of claim 1, wherein defining a zone further comprises upsizing the selected isolated vias a predetermined amount based on an original size of the isolated vias.

5. The method of claim 1, wherein defining a zone around each of the selected isolated vias further comprises defining the zone to have a dimension no larger than an order of magnitude of a minimum metal feature size for the semiconductor device.

6. The method of claim 1, wherein identifying isolated vias of the plurality of vias further comprises identifying isolated vias to be vias having no other vias within two times a minimum pitch between metal lines for the semiconductor device.

7. The method of claim 1, wherein adding tiling features further comprises adding tiling features to obtain a metal coverage of no less than twenty percent of surface area within the zone.

8. The method of claim 1, wherein the method is performed for interlevel dielectric layers of the semiconductor device comprising a low-k oxide.

9. The method of claim 1, wherein defining a zone around each of the selected isolated vias further comprises upsizing the selected isolated vias by 0.9 microns per side.

10. A method for tiling selected vias in a semiconductor device having a plurality of vias, the method comprising:
    generating a layout database for the semiconductor device;
    creating a plurality of polygon shapes by upsizing the plurality of vias;
    discounting polygon shapes of the plurality of polygon shapes that enclose more than one via as being not isolated;
    selecting vias in remaining polygon shapes as being isolated vias;
    upsizing the selected vias by a predetermined amount based on an original size of the selected vias; and
    adding a plurality of tiling features on a metal layer above the selected vias and within a space enclosed by the upsized selected vias.

11. The method of claim 10 wherein adding a plurality of tiling features on a metal layer above the selected vias and within a space enclosed by the upsized selected vias further comprises defining the space enclosed by the upsized selected vias as being no larger than an order of magnitude of a minimum metal feature size for the semiconductor device.

12. The method of claim 10, further comprising selecting dimensions of the polygons used to pattern the tiling features for metallization such that the tiling features are capable of fitting into an existing layout and to meet a density goal of greater than 20% in the space enclosed by the upsized selected vias.

13. The method of claim 10, wherein selecting vias in remaining polygon shapes as being isolated vias further comprises sizing the polygon shapes to be no greater than two times a minimum pitch between metal lines for the semiconductor device.

14. The method of claim 10, wherein adding a plurality of tiling features on a metal layer above the selected vias and within a space enclosed by the upsized selected vias further comprises adding tiling features to obtain a metal coverage of no less than twenty percent of surface area within the space enclosed by the upsized selected vias.

15. The method of claim 10, wherein the method is performed for interlevel dielectric layers of the semiconductor device comprising a low-k oxide.

* * * * *